United States Patent
Hong et al.

(10) Patent No.: US 7,486,210 B1
(45) Date of Patent: Feb. 3, 2009

(54) DWA STRUCTURE AND METHOD THEREOF, DIGITAL-TO-ANALOG SIGNAL CONVERSION METHOD AND SIGNAL ROUTING METHOD

(75) Inventors: Ghia-Ming Hong, Hsinchu (TW); Chia-Wei Chang, Taichung County (TW); Yan-Hua Peng, Hsinchu (TW); Kuang-Chih Liu, Hsinchu (TW); Chung-Fu Lin, Taipei County (TW)

(73) Assignee: Faraday Technology Corp., Hsinchu (TW)

( * ) Notice: Subject to any disclaimer, the term of this patent is extended or adjusted under 35 U.S.C. 154(b) by 0 days.

(21) Appl. No.: 11/835,094

(22) Filed: Aug. 7, 2007

(51) Int. Cl.
    *H03M 7/00* (2006.01)
(52) U.S. Cl. .......................................... 341/60; 341/50
(58) Field of Classification Search ............... 341/50–80
    See application file for complete search history.

(56) References Cited

U.S. PATENT DOCUMENTS

| | | | |
|---|---|---|---|
| 6,218,977 B1 * | 4/2001 | Friend et al. ............... | 341/163 |
| 6,344,812 B1 | 2/2002 | Takeda et al. | |
| 6,535,155 B2 * | 3/2003 | Ruha et al. ................. | 341/144 |

OTHER PUBLICATIONS

Ichiro Fujimori, Akihiro Nogi, and Tetsuro Sugimoto, "A Multibit Delta-Sigma Audio DAC with 120-dB Dynamic Range", IEEE Journal of Solid-State Cirtuits. vol. 35. No. 8. [1066-1073], Aug. 2000.
Marzia Annovazzi, Vittorio Colonna, Gabriele Gandolfi, Fabrizio Stefani, and Andrea Baschirotto, "A Low-Power 98-dB Multibit Audio DAC in a Standard 3.3-V 0.35um CMOS Technology", IEEE Journal of Solid-State Cirtuits, vol. 37, No. 7, [825-834], Jul. 2002.

* cited by examiner

*Primary Examiner*—Lam T Mai
(74) *Attorney, Agent, or Firm*—J.C. Patents

(57) ABSTRACT

A data weighted average (DWA) structure including a first delay unit, a binary to thermometer code converter, an adder, a second delay unit, a decoder, a barrel shifter, and a plurality of signal lines is provided. The first delay unit delays an input digital signal. The binary to thermometer code converter converts an output signal of the first delay unit into a thermal code. The second delay unit delays an output signal of the adder. The adder adds the input digital signal to an output signal of the second delay unit. The decoder decodes the output signal of the second delay unit. The barrel shifter generates an output signal from the thermal code in accordance with an output signal of the decoder. The signal lines route the output signal of the barrel shifter into two independent control signal groups.

4 Claims, 4 Drawing Sheets

DWA STRUCTURE AND METHOD THEREOF, DIGITAL-TO-ANALOG SIGNAL CONVERSION METHOD AND SIGNAL ROUTING METHOD

BACKGROUND OF THE INVENTION

1. Field of the Invention

The present invention generally relates to a data weighted average (DWA) structure and a digital-to-analog signal conversion method, in particular, to a DWA structure and a digital-to-analog signal conversion method for reducing errors caused by element mismatch.

2. Description of Related Art

Digital-to-analogy converters (DACs) and analog-to-digital converters (ADCs) have been broadly applied to communication systems, consumer electronic products, and audio equipments etc. However, within DACs or ADCs, non-linear problems caused by element mismatch are inevitable, and such problems are very crucial to a sigma-delta modulator (SDM).

Dynamic element matching (DEM) has been provided for resolving the non-linear problems in DACs, wherein data weighted averaging (DWA) is a well-known DEM algorithm. Generally speaking, DWA realizes first-order noise shaping and reduces element mismatch effect. In addition, DWA can reduce capacitor mismatch at the input terminal of analog circuits (for example, a switched-capacitor reconstruction filter, SCF) in DACs; thus, DWA has good signal noise ratio (SNR) and total harmonic distortion (THD) performance.

However, the existing DWA structures still have some problems. For example, in-band tone may be produced in the existing DWA structures, thus, the spur-free dynamic range (SFDR) performance may not be satisfactory. In addition, existing high resolution DACs have low efficiency and large circuit area.

Accordingly, a new DWA structure having foregoing and/or other advantages but without foregoing and/or other problems is to be provided.

SUMMARY OF THE INVENTION

Accordingly, the present invention is directed to a data weighted average (DWA) structure having reduced circuit area and reduced in-band tone.

The present invention is directed to a capacitor control method for a switched capacitor filter to be applied to digital-to-analog signal conversion for reducing errors caused by capacitors mismatch during long time operation.

According to an example of the present invention, a DWA structure including a first delay unit, a binary to thermometer code converter, an adder, a second delay unit, a decoder, a barrel shifter, and a plurality of signal lines is provided. The first delay unit receives and delays an input digital signal. The binary to thermometer code converter receives an output signal from the first delay unit and converts the output signal into a thermal code. The adder receives the input digital signal. The second delay unit receives and delays an output signal of the adder. An output signal of the second delay unit further feeds back to the adder. The adder adds the input digital signal to an output signal of the second delay unit to obtain the output signal thereof. The decoder receives and decodes the output signal of the second delay unit. The barrel shifter receives the thermal code from the binary to thermometer code converter and generates an output signal according to an output signal of the decoder. The signal lines route the odd bit in the output signal of the barrel shifter into a low-bit signal of a DWA output digital signal and route the even bit in the output signal of the barrel shifter into a high-bit signal of the DWA output digital signal.

According to another example of the present invention, a signal routing method adapted to a DWA structure is provided. The signal routing method at least includes following steps. An M-bit input digital signal is provided. The odd bit in the input digital signal is routed into a low-bit signal of an output digital signal, and the even bit in the input digital signal is routed into a high-bit signal of the output digital signal, wherein the output digital signal has M bits.

According to yet another example of the present invention, a digital-to-analog signal conversion method is provided. The method includes at least following steps. An input digital signal having a plurality of bits is provided, wherein these bits are evenly distributed in a first signal block and a second signal block. A plurality of capacitors is provided, wherein these capacitors are evenly distributed in a first capacitor block and a second capacitor block, and the pattern for distributing these capacitors is related to the unit capacitance errors of these capacitors. The charge order of the capacitors in the first capacitor block is determined according to the relationships of the unit capacitance errors of the capacitors in the first capacitor block. The charge order of the capacitors in the second capacitor block is determined according to the relationships of the unit capacitance errors of the capacitors in the second capacitor block. How many capacitors are to be charged is determined according to the input digital signal. The capacitors to be charged are selected alternatively from the first and the second capacitor block, and the current selection is corresponding to the previous selection. The capacitors are charged according to the input digital signal so as to perform the digital-to-analog signal conversion.

According to still another example of the present invention, a data weighted averaging method for a plurality of conversion units is provided. The method at least includes following steps. The conversion units are grouped into at least a first block and a second block. The conversion units are selected alternatively from the first and the second block to obtain the DWA thereof, wherein when one of the conversion units in the first block is to be selected, the currently selected conversion unit is located at one side of the previously selected conversion unit, and when one of the conversion units in the second block is to be selected, the currently selected conversion unit is located at the other side of the previously selected conversion unit.

According to yet still another example of the present invention, a data weighted averaging method for a plurality of conversion units is provided. The method at least includes following steps. The conversion units are grouped into at least a first block and a second block. The conversion units are selected alternatively from the first and the second block to obtain the DWA thereof, wherein when one of the conversion units in the first block is to be selected, the conversion unit is selected from the first block in one direction, and when one of the conversion units in the second block is to be selected, the conversion unit is selected from the second block in another direction.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
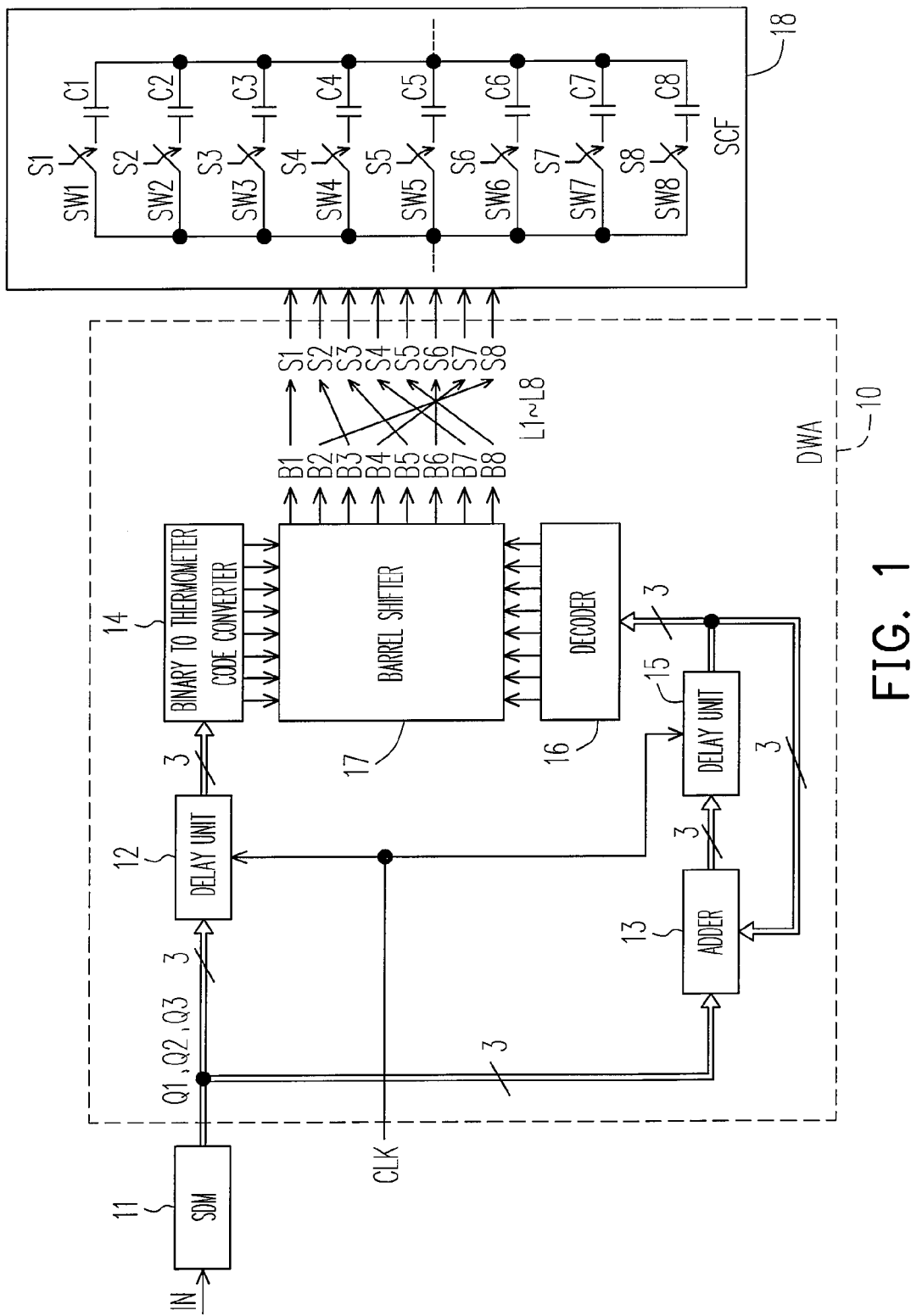
FIG. 1 is a circuit diagram of a data weighted average (DWA) structure according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

According to embodiments of the present invention, a new data weighted average (DWA) structure is provided for generating an output signal using DWA algorithm. The DWA output signal is routed into two control signal groups which operate (or rotate) independently through signal routing. The two control signal groups are used for controlling charging of internal capacitors of, for example, a switched-capacitor reconstruction filter (SCF). Errors caused by capacitor mismatch in the SCF during long time operation can be reduced, and accordingly the operation accuracy of the circuitry can be improved.

FIG. 1 is a circuit diagram of a data weighted average (DWA) structure according to an embodiment of the present invention. The DWA structure in the present embodiment can be applied to a sigma-delta modulator (SDM). Referring to FIG. 1, the DWA structure 10 includes a delay unit 12, an adder 13, a binary to thermometer code converter 14, a delay unit 15, a decoder 16, and a barrel shifter 17. The delay unit 12 and the delay unit 15 operate synchronously, and they are both controlled by a clock signal CLK.

In the present embodiment, the SDM 11 may be a quantizer and convert an input signal IN (for example, a high-bit digital input signal such as a 12-bit digital signal, a 14-bit digital signal, or a 16-bit digital signal) into a low-bit digital signal. As shown in FIG. 1, the SDM 11 converts the input digital signal IN into a 3-bit digital signal Q3~Q1. The 3-bit digital signal Q3~Q1 is input to the delay unit 12 and the adder 13.

The delay unit 12 delays the 3-bit digital signal Q3~Q1 and outputs the delayed signal to the binary to thermometer code converter 14. The binary to thermometer code converter 14 converts the delayed 3-bit digital signal Q3~Q1 into an 8-bit digital thermal code A8~A1. For example, if the 3-bit digital signal Q3~Q1 is [000], the 8-bit thermal code A8~A1 converted by the binary to thermometer code converter 14 is [00000001], and if the 3-bit digital signal Q3~Q1 is [001], the 8-bit thermal code A8~A1 is [00000011]. The conversions between the digital signal Q3~Q1 and the thermal code A8~A1 are listed below:

TABLE 1

| Q3~Q1 | A8~A1 |
|---|---|
| 000 | 00000001 |
| 001 | 00000011 |
| 010 | 00000111 |
| 011 | 00001111 |
| 100 | 00011111 |
| 101 | 00111111 |
| 110 | 01111111 |
| 111 | 11111111 |

The binary to thermometer code converter 14 outputs the 8-bit thermal code A8~A1 to the barrel shifter 17 as an 8-bit input digital signal of the barrel shifter 17.

The SDM 11 outputs the 3-bit digital signal Q3~Q1 to the adder 13. The adder 13 and the delay unit 15 form a feedback system. The output of the delay unit 15 is defined as the output of the feedback system. The adder 13 and the decoder 16 receive the 3-bit output signal of the feedback system. The adder 13 adds the 3-bit digital signal Q3~Q1 to the output signal of the delay unit 15, and then the delay unit 15 delays the 3-bit output signal of the adder 13 and outputs to the adder 13 and the decoder 16.

The decoder 16 receives the 3-bit output signal of the feedback system and decodes it into an 8-bit digital signal. The 8-bit digital signal output by the decoder 16 is used for controlling output configuration of the output signal B8~B1 of the barrel shifter 17.

As described above, the 8-bit digital signal output by the decoder 16 is used as the control signal of the barrel shifter 17, and the 8-bit digital signal A8~A1 output by the binary to thermometer code converter 14 is used as the 8-bit input digital signal of the barrel shifter 17.

The 8-bit output signal B8~B1 of the barrel shifter 17 is routed by the signal lines L1~L8 into a digital signal S8~S1, and the digital signal S8~S1 can be used as a switch control signal of an 8-level SCF 18. Each switch and the corresponding capacitor form a conversion unit. As shown in FIG. 1, the signal bits B1, B2, B3, B4, B5, B7, and B8 are respectively connected to the signal bits S1, S8, S2, S7, S3, S6, S4, and S5. Or, the connections between the output signal B8~B1 and the digital signal S8~S1 may be expressed as:

$$B(2i-1)=S(i)$$

$$B(2i)=S(n+1-i),$$

wherein n represents the total bit number of the signal and is a positive even number (as shown in FIG. 1, n=8), and i is a positive integer between 1~n/2.

The 8 signal bits S8~S1 can be distributed into block 1 and block 2 according to the operation of the barrel shifter 17 and the connection pattern between the signal B8~B1 and the signal S8~S1, wherein block 1 contains signal bits S1~S4 (the first half of the signal), and block 2 contains signal bits S5~S8 (the second half of the signal).

Only a part of the internal structure of the 8-level SCF 18 is illustrated in FIG. 1. Referring to FIG. 1, the 8-level SCF 18 includes switches SW1~SW8 and capacitors C1~C8. The signal bits S8~S1 respectively control the on/off of the switches SW8~SW1, and the on/off states of the switches SW1~SW8 determine whether or not the capacitors C1~C8 are charged. The capacitors C1~C8 are grouped into blocks, for example block 1 and block 2, wherein C1~C4 are in block 1 and C5~C8 are in block 2.

In the present embodiment, the rule of selecting the capacitors C1~C8 to be charged is as following:

(1) How many capacitors are to be charged is determined according to the input signal Q3~Q1. For example, 1, 2, 3, 4, 5, 6, 7, and 8 capacitors are charged when the input signal is respectively [000], [001], [010], [011], [100], [101], [110], and [111], respectively.

(2) Capacitors in the two blocks are selected alternatively, and the current selection is based on the previous selection.

(3) In block 1, the capacitors are selected in the order of: C1→C2→C3→C4→C1→C2→C3→C4 . . . (assuming capacitor C1 is selected first). In block 2, the capacitors are selected in the order of: C8→C7→C6→C5→C8→C7→C6→C5 . . . (assuming capacitor C8 is selected first).

Figure 2:
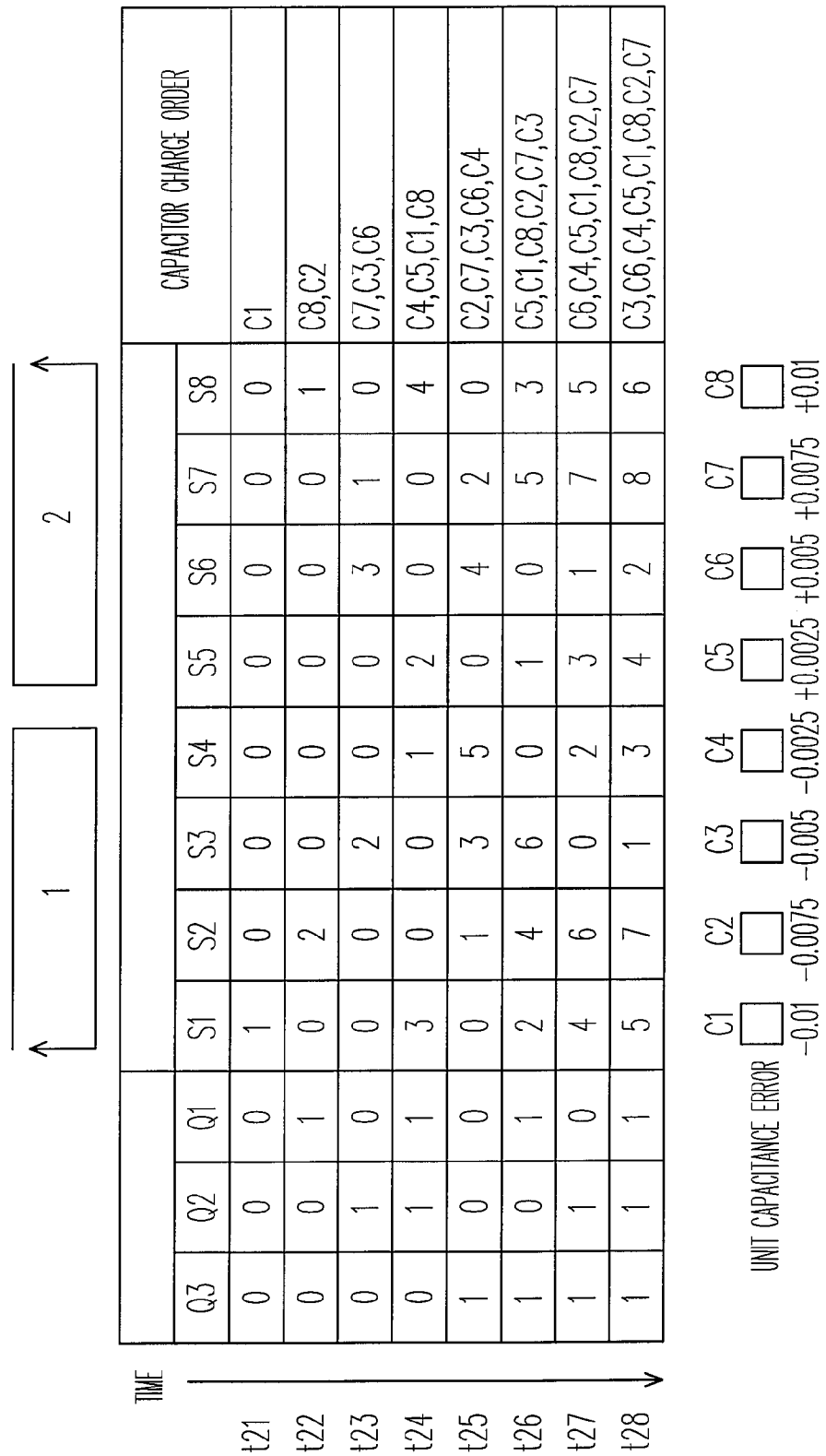
FIGS. 2~4 illustrate the relationships between an input signal Q3~Q1 and an output signal S8~S1 in the DWA structure according to the embodiment of the present invention.
Figure 3:
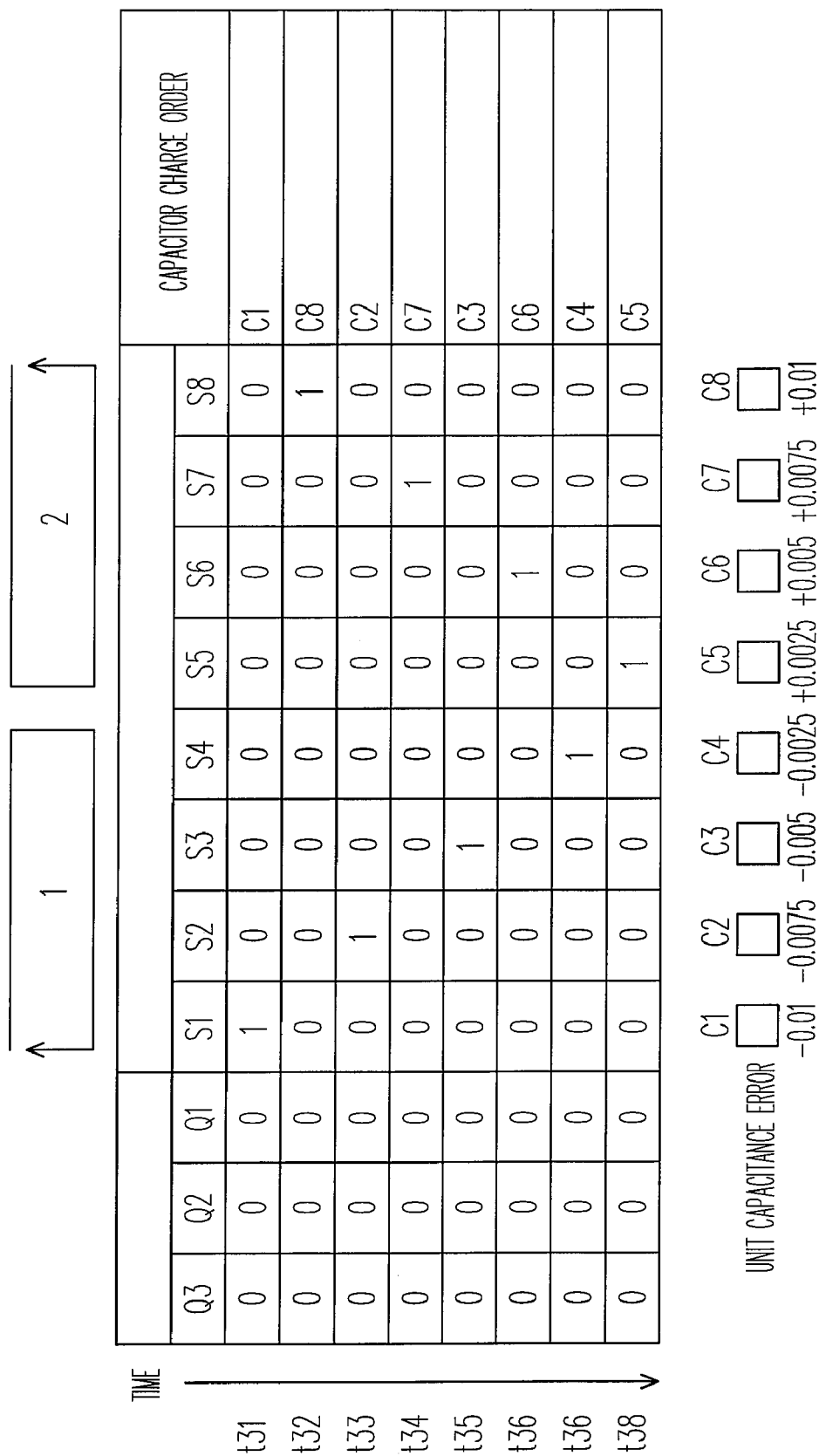
Figure 4:
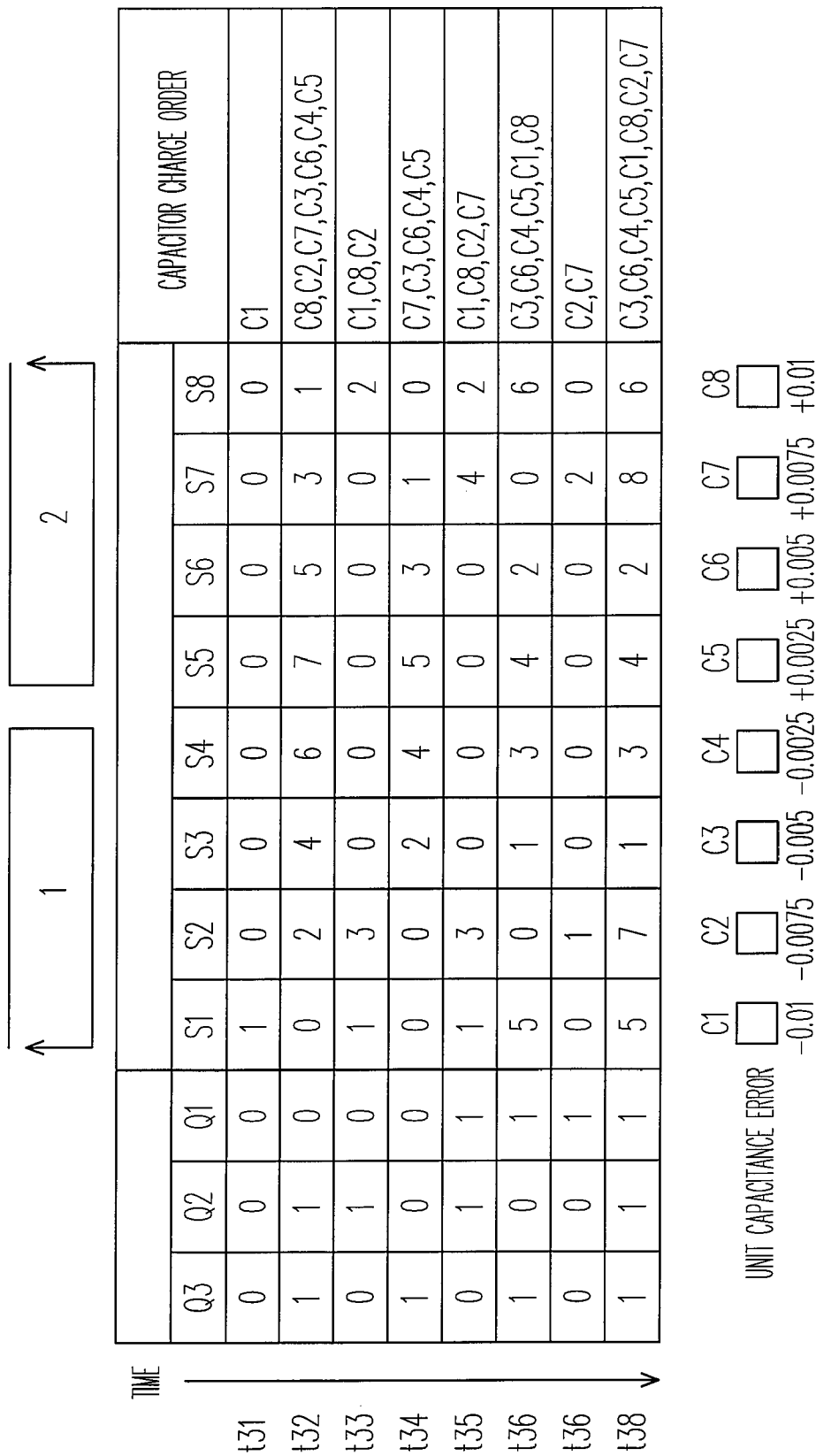

FIGS. 2~4 illustrate the relationships between the input signal Q3~Q1 and the output signal S8~S1 of the DWA structure according to the embodiment of the present invention. The rule for selecting capacitors to be charged can be understood clearly by referring to FIG. 2~FIG. 4. In the present embodiment, it is assumed that the unit capacitance errors of the capacitors C1~C8 are respectively (−0.01), (−0.0075), (−0.005), (−0.0025), (+0.0025), (+0.005), (+0.0075), and (+0.01). Generally speaking, the unit capacitance errors are linear in consideration of process drift. Thus, the capacitors having larger unit capacitance errors are distributed at two ends of the capacitor array (as the capacitors C1 and C8 in FIG. 1). A capacitor is charged when the corresponding switch is turned on. For example, the capacitor C1 is charged when the switch SW1 is turned on.

Refer to FIG. 2, wherein time point t21 is assumed to be the start point. At time point t21, the signal Q3~Q1 is 000, the signal S1 is 1, and the other signals are 0. Here the capacitor C1 is charged (which is default setting), while the other capacitors are not charged. In the following, "selecting" a capacitor means "charging" the capacitor.

At time point t22, the signal Q3~Q1 is 001, the signals S8 and S2 are 1, and the other signals are 0. Here the capacitors C8 and C2 are charged (in the order of C8→C2), while the other capacitors are not charged. The reason of selecting and charging the capacitors in the order of C8→C2 will be described herein. The previously selected capacitor (C1) (at time point t21) belongs to block 1, and thus, at time point t22, a capacitor in block 2 is to be selected. The capacitor C8 in block 2 is then selected (which is default setting). After that, a capacitor in block 1 is to be selected. Since the previously selected capacitor in block 1 is capacitor C1, the capacitor C2 is then selected. In FIGS. 2~4, signal 0 represents that the corresponding capacitor is not be selected, while the parameter m represents the order in which the corresponding capacitor is selected, wherein m is a positive integer between 1~n.

At time point t23, the signal Q3~Q1 is 010, the signals S7, S3, and S6 are 1, and the other signals are 0. Thus, the capacitors C7, C3, and C6 are sequentially charged, while the other capacitors are not charged. The reason of selecting the capacitors in the order of C7→C3→C6 will be described herein. The previously selected capacitor (C2) (at time point t22) belongs to block 1, thus, at time point t23, a capacitor in block 2 is to be selected. Since in block 2, the previously selected capacitor is capacitor C8, the capacitor C7 is then selected. After that, a capacitor in block 1 is to be selected. Since in block 1, the previously selected capacitor is capacitor C2, the capacitor C3 is then selected.

Accordingly, at time point t24, capacitors C4, C5, C1, and C8 are selected sequentially; at time point t25, capacitors C2, C7, C3, C6, and C4 are selected sequentially; at time point t26, capacitors C5, C1, C8, C2, C7, and C3 are selected sequentially; at time point t27, capacitors C6, C4, C5, C1, C8, C2, and C7 are selected sequentially; and at time point t28, capacitors C3, C6, C4, C5, C1, C8, C2, and C7 are selected sequentially.

At time points t21~t28, the capacitors C1~C8 are respectively selected 5, 5, 4, 4, 4, 4, 5, and 5 times. Thus, the average capacitance error during this period is:

$$(-0.01)*5+(-0.0075)*5+(-0.005)*4+(-0.0025)*4+(+0.0025)*4+(+0.005)*4+(+0.0075)*5+(+0.01)*5=0.$$

FIG. 3 illustrates another example about how to determine the output signal S8~S1 according to the input signal Q3~Q1. Refer to FIG. 3, wherein time point t31 is assumed to be the start point.

At time point t31, the signal Q3~Q1 is 000, the signal S1 is 1, and the other signals are 0. Here the capacitor C1 is charged (which is default setting), while the other capacitors are not charged.

At time point t32, the signal Q3~Q1 is 000, the signal S8 is 1, and the other signals are 0. Here the capacitor C8 is charged, while the other capacitors are not charged. The reason of selecting the capacitor C8 will be described herein. Since the previously selected capacitor (C1) (at time point t31) belongs to block 1, at time point t32, a capacitor in block 2 is to be selected. Then capacitor C8 in block 2 is first selected (which is default setting).

At time point t33, the signal Q3~Q1 is 000, the signal S2 is 1, and the other signals are 0. Thus, the capacitor C2 is charged, while the other capacitors are not charged. The reason of selecting the capacitor C2 will be described herein. Since the previously selected capacitor (C8) (at time point t32) belongs to block 2, at time point t33, a capacitor in block 1 is to be selected. In block 1, the previously selected capacitor is capacitor C1, thus, the capacitor C2 is then selected.

Accordingly, at time point t34, capacitor C7 is selected; at time point t35, capacitor C3 is selected; at time point t36, capacitor C6 is selected; at time point t37, capacitor C4 is selected; and at time point t38, capacitor C5 is selected.

At time points t31~t38, the capacitors C1~C8 are all selected once. Thus, the average capacitance error during this period is:

$$(-0.01)*1+(-0.0075)*1+(-0.005)*1+(-0.0025)*1+(+0.0025)*1+(+0.005)*1+(+0.0075)*1+(+0.01)*1=0.$$

FIG. 4 illustrates another example about how to determine the output signal S8~S1 according to the input signal Q3~Q1. Refer to FIG. 4, wherein time point t41 is assumed to be the start point.

At time point t41, the signal Q3~Q1 is 000, the signal S1 is 1, and the other signals are 0. Here the capacitor C1 is charged (which is default setting), while the other capacitors are not charged.

At time point t42, the signal Q3~Q1 is 110, the signals S8, S2, S7, S3, S6, S4, and S5 are 1, and the other signals are 0. Thus, the capacitors C8, C2, C7, C3, C6, C4, and C5 are sequentially charged, while the other capacitors are not charged. The reason of selecting the capacitors C8, C2, C7, C3, C6, C4, and C5 in such an order will be described herein. The previously selected capacitor (C1) (at time point t41) belongs to block 1, thus, at time point t42, a capacitor in block 2 is to be selected. The capacitor C8 in block 2 is then selected (which is default setting). Next, a capacitor in block 1 is to be selected. In block 1, the previously selected capacitor is capacitor C1, thus, the capacitor C2 is then selected. After that, the capacitor C7 in block 2 is selected (because the previously selected capacitor in block 2 is capacitor C8). And so on, the order in which the capacitors are selected can be obtained as described above.

At time point t43, the signal Q3~Q1 is 010, the signals S1, S8, and S2 are 1, and the other signals are 0. Thus, the capacitors C1, C8, and C2 are sequentially charged, while the other capacitors are not charged. The reason of selecting the capacitors C1, C8, and C2 in such an order will be described herein. Since the previously selected capacitor (C5) (at time point t32) belongs to block 2, at time point t43, a capacitor in block 1 is to be selected. In block 1, the previously selected capacitor is capacitor C4, thus, the capacitor C1 is selected. After that, the capacitor C8 in block 2 is then selected (because the previously selected capacitor in block 2 is capacitor C5). Next, the capacitor C2 in block 1 is selected (because the previously selected capacitor in block 1 is capacitor C1).

Accordingly, at time point t44, capacitors C7, C3, C6, C4, and C5 are selected; at time point t45, capacitors C1, C8, C2, and C7 are selected; at time point t46, capacitors C3, C6, C4, C5, C1, and C8 are selected; at time point t47, capacitors C2 and C7 are selected; and at time point t48, capacitors C3, C6, C4, C5, C1, C8, C2, and C7 are selected.

At time points t41~t48, the capacitors C1~C8 are respectively selected 5, 5, 4, 4, 4, 4, 5, and 5 times. Thus, the average capacitance error during this period is:

$$(-0.01)*5+(-0.0075)*5+(-0.005)*4+(-0.0025)*4+(+0.0025)*4+(+0.005)*4+(+0.0075)*5+(+0.01)*5=0.$$

According to the present embodiment, errors caused by large unit capacitance errors and by small unit capacitance errors may be cancelled, reduced or eliminated. Accordingly, during long operation period, the entire average error caused by element mismatch may be cancelled, reduced or eliminated.

Additionally, even though in foregoing description, the capacitor having the largest unit capacitance error in each block is selected first, the present embodiment is not limited thereto. Since the selection rule allows those capacitors having symmetrical errors to be selected alternatively, the same effect can be achieved as well. For Example, the capacitors may also be selected in the direction of: C2→C3→C4→C1→C2 . . . (block 1) and C7→C6→C5→C8→C7 . . . (block 2). The present embodiment can be implemented variously by those skilled in the art without departing the scope and spirit of the present invention.

In the embodiment illustrated in FIG. 1, various DWA alternations may be implemented by changing the mapping between the signals B1~B8 and S1~S8 constructed by the signal lines L1~L8. For example, if the routing of the signal lines L1~L8 is to map the signal bits B1~B8 respectively to S4, S5, S3, S6, S2, S7, S1, and S8, then the capacitors in block 1/block 2 can be selected/charged alternatively in anticlockwise/clockwise direction. In addition, if the routing of the signal lines L1~L8 is to map the signal bits B1~B8 respectively to S1, S5, S2, S6, S3, S7, S4, S8, then the capacitors in both block1 and block 2 can be selected/charged alternatively in clockwise direction. Moreover, if the routing of the signal lines L1~L8 is to map the signal bits B1~B8 respectively to S1, S4, S6, S2, S5, S7, S3, S8, then the capacitors C1~C8 can be grouped into three blocks (the capacitors C1~C3 are in one block, the capacitors C4~C5 are in another block, and the capacitors C6~C8 are in yet another block), and capacitors in the three blocks can be selected/charged alternatively in clockwise direction.

The structures of the delay unit 12, the adder 13, the binary to thermometer code converter 14, the delay unit 15, the decoder 16, and the barrel shifter 17 are not limited in the present embodiment, and any structures thereof may be used as long as they can accomplish foregoing functions. In addition, the signal S1-S8 may be used for controlling other types of digital-to-analog conversion units besides the capacitors C1~C8 in FIG. 1.

Compared to the conventional DWA structure, the circuit area of the DWA structure in the present embodiment is reduced.

In overview, the DWA structure in the present embodiment may reduce in-band tone. Moreover, the DWA structure in the present embodiment may also reduce signal-dependent harmonic distortion.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data weighted average (DWA) structure, comprising:
   a first delay unit, receiving and delaying an input digital signal;
   a binary to thermometer code converter, receiving an output signal from the first delay unit and converting the output signal of the first delay unit into a thermal code;
   an adder, receiving the input digital signal;
   a second delay unit, receiving and delaying an output signal of the adder, an output signal of the second delay unit further feeding back to the adder, the adder adding the input digital signal to the output signal of the second delay unit to obtain the output signal of the adder;
   a decoder, receiving and decoding the output signal of the second delay unit;
   a barrel shifter, receiving the thermal code from the binary to thermometer code converter and generating an output signal according to an output signal of the decoder; and
   a plurality of signal lines, routing an odd bit in the output signal of the barrel shifter into a low-bit signal of a DWA output digital signal, and routing an even bit in the output signal of the barrel shifter into a high-bit signal of the DWA output digital signal.

2. The DWA structure according to claim 1, wherein the first delay unit and the second delay unit operate synchronously.

3. The DWA structure according to claim 1, wherein a connection between the odd bit in the output signal of the barrel shifter and the low-bit signal of the DWA output digital signal constructed by the signal lines is:

$$B(2i-1)=S(i)$$

wherein $B(2i-1)$ represents the odd bit in the output signal of the barrel shifter, $S(i)$ represents the low-bit signal of the DWA output digital signal, i is a positive integer between 1 and M/2, and M is the bit number of the output signal of the barrel shifter.

4. The DWA structure according to claim 1, wherein a connection between the even bit in the output signal of the barrel shifter and the high-bit signal of the DWA output digital signal constructed by the signal lines is:

$$B(2i)=S(M+1-i)$$

wherein $B(2i)$ represents the odd bit in the output signal of the barrel shifter, $S(M+1-i)$ represents the high-bit signal of the DWA output digital signal, i is a positive integer between 1 and M/2, and M is the bit number of the output signal of the barrel shifter.

* * * * *